(12) United States Patent
Otterstedt et al.

(10) Patent No.: US 9,190,149 B2
(45) Date of Patent: Nov. 17, 2015

(54) METHOD AND SYSTEM FOR SWITCHABLE ERASE OR WRITE OPERATIONS IN NONVOLATILE MEMORY

(75) Inventors: Jan Otterstedt, Unterhaching (DE); Wolf Allers, Munich (DE); Mihail Jefremow, Augsburg (DE); Edvin Paparisto, Munich (DE); Leonardo Castro, Munich (DE); Christian Peters, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 432 days.

(21) Appl. No.: 13/593,618

(22) Filed: Aug. 24, 2012

(65) Prior Publication Data

US 2014/0056079 A1    Feb. 27, 2014

(51) Int. Cl.
*G11C 16/04* (2006.01)
*G11C 16/14* (2006.01)

(52) U.S. Cl.
CPC ............ *G11C 16/0433* (2013.01); *G11C 16/14* (2013.01)

(58) Field of Classification Search
CPC .................................. G11C 16/16; G11C 16/14
USPC ......................................... 365/185.18, 185.29
See application file for complete search history.

(56) References Cited

U.S. PATENT DOCUMENTS

2007/0280004 A1* 12/2007 Sugawara ................. 365/185.29
2010/0014343 A1*  1/2010 Wei et al. ...................... 365/148

* cited by examiner

*Primary Examiner* — Huan Hoang
(74) *Attorney, Agent, or Firm* — Eschweiler & Associates, LLC

(57) ABSTRACT

Embodiments relate to systems and methods including a step of switching between two or more erase operations and/or two or more write operations for erasing of and/or writing to least one memory cell of a nonvolatile memory enabling to select a most suitable erase and/or write operation for a particular erase and/or write operation within the memory.

8 Claims, 5 Drawing Sheets

METHOD AND SYSTEM FOR SWITCHABLE ERASE OR WRITE OPERATIONS IN NONVOLATILE MEMORY

FIELD

The present invention relates generally to methods and systems for switchable erase or write operations in memory, and, in particular in nonvolatile memory (NVM) such as flash memory.

BACKGROUND

For nonvolatile memories, two operations need to be enabled by the design that are changing the storage state of the NVM memory cells, namely erasing and writing. In this regard, erasing is typically possible only for larger chunks of data such as words, blocks, wordlines, or sectors. For that purpose, the larger chunk of stored data is reset by the erase operation to the same default value—for example either "all-0" or "all-1". In contrast to that, writing is necessarily possible in a bitwise—i.e. selective—way to enable storage of arbitrary data for each memory cell or bit individually.

Bitwise writing can either be an implementation of a highly parallel but nevertheless slow method such as e.g. "Fowler-Nordheim"-tunneling, or a fast but highly power consuming and therefore low parallel method, such as for example "Hot Electron" injection.

For area-efficient flash memories, the erase granularity or selectivity is currently typically at least a wordline (≥1000 Bits), therefore a selective erasure of single words or even single bits is not possible. Conventionally, an erase operation that is capable of selecting individual words typically requires the implementation of an area-inefficient EEPROM array. This implies that "word switches" need to be integrated in the memory array itself that allow to select the corresponding words for individual erasure.

Under certain circumstances, a fast bitwise erase operation may be highly favorable also for flash memories. For instance, this may be the case when single erased cells are disturbed during writing of a different portion of data. In this case, the whole page would have to be erased again and rewritten, resulting in an unexpected effective write time delay of several orders of magnitude.

SUMMARY

The invention is directed to enabling a selective modification (erasing/writing) of words or even bits in a flash memory, i.e. in a memory without word switches in the array. In one embodiment the corresponding modifying operations for memory cells may be performed very fast.

A method and system for switchable erase or write operations in memory is provided, substantially as shown in and/or described in connection with at least one of the figures, as set forth more completely in the claims.

Further features and advantages of embodiments will become apparent from the following detailed description made with reference to the accompanying drawings.

BRIEF DESCRIPTION OF THE DRAWINGS

The accompanying drawings are included to provide a further understanding and are incorporated in and constitute a part of this specification. The drawings relate to examples and embodiments and together with the description serve to explain the principles of the invention. Other embodiments and many of the intended advantages of embodiments will be readily appreciated as they become better understood by reference to the following detailed description.

DETAILED DESCRIPTION

Figure 1:
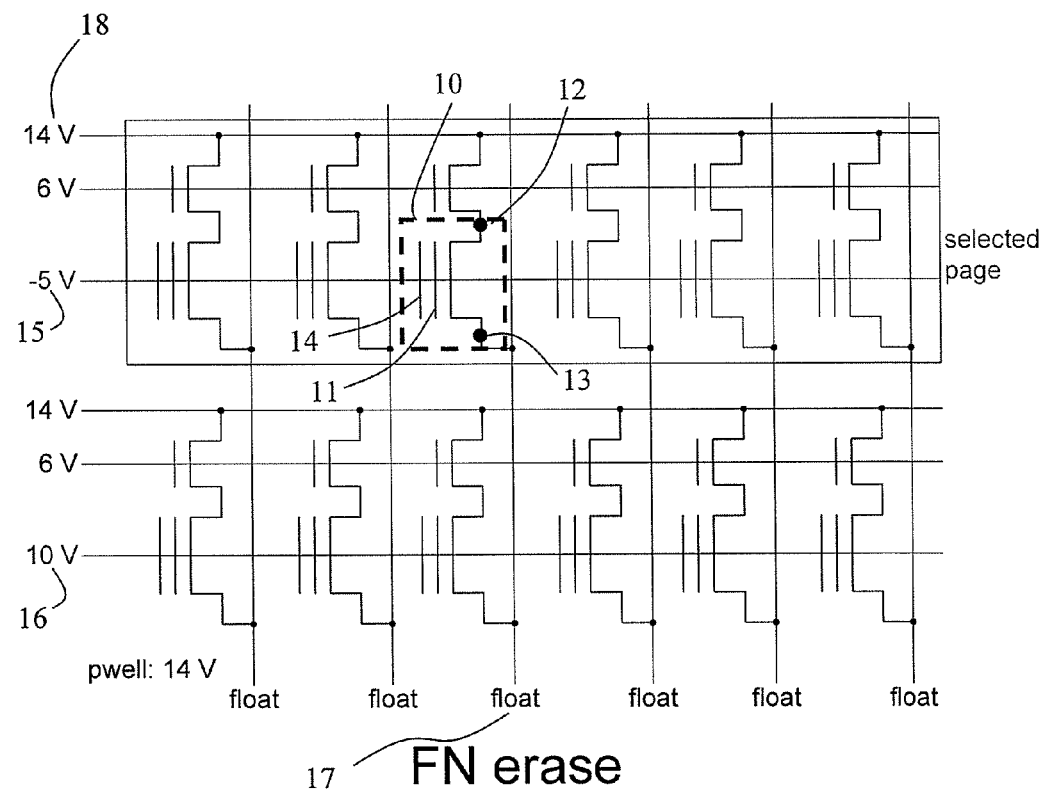
FIG. 1 is a schematic diagram illustrating possible voltage conditions to select a page of memory cells in a flash memory for a "Fowler-Nordheim"-erase operation according to an embodiment.

In the following Detailed Description, reference is made to the accompanying drawings, which form a part hereof, and in which are shown by way of illustration specific embodiments. It is to be understood that other embodiments may be utilized and structural or other changes may be made without departing from the scope of the present invention. The following detailed description, therefore, is not to be taken in a limiting sense, and the scope of the present invention is defined by the appended claims.

In the following, for illustration purposes, the invention will be described with reference to flash memory. However, the invention is not so limited and may find its application in conjunction with switchable erase or write operations for any other type of nonvolatile memory.

"Hot-hole" erase operations, in the following HH-erase, in principle allows to implement a selective and fast erasing. The erase operation here may be viewed as the inverse operation of the often employed write operation with "Hot Electrons", in the following HE. Unfortunately, HH-erase operations may damage the erased memory cell and therefore should not be repeated very often. Furthermore, HH-erase operations may consume a relatively high current.

The normally employed low-current erase operation of "Fowler-Nordheim(-Tunneling)"-erase, in the following FN-erase, may allow a high number of repetitions of the erase operation since it typically causes much less damage to the erased memory cell when compared to a HH-erase operation. Unfortunately, FN-erasing is typically designed to erase at least a wordline, and, thus, does not allow to selectively erase a word or bit without further means such as word switches in a memory array.

Consequently, in an embodiment, two different erase methods or operations may be implemented for the same flash memory array. Namely, firstly, an FN-erase operation may be implemented as a first erase operation for "normal" bulk erase operations, allowing a high cycle count, i.e. a high number of total erase operations that may be applied to a particular memory cell. Secondly, an HH-erase operation may be implemented as a second erase operation for selective and fast erase operations, which should, however, only be allowed for a low cycle count to avoid critical damage to a particular memory cell.

In embodiments, a switchable implementation of the two methods may allow to select the more suitable erase operation, which is not possible with a design that implements only one erase method. In one embodiment, the FN bulk erase should be applied wherever possible, enabling a high cycle count. In contrast to that, the HH selective erase should be applied for timing critical "repair" e.g. of disturbed bits.

Moreover, in one embodiment, an "incremental HH erase" may be provided as a counterpart to an "incremental HE write", the latter enabling selective write operations to a wordline. In a further embodiment, an HH erase operation for real EEPROM behavior may be configured to even be selectable for only parts of the memory.

In an extension of the above-mentioned embodiment, two switchable write operations may be implemented. Namely, firstly a HE write operation may be provided that may be fast and selective, but slightly damaging to a NVM cell and using increased currents. And secondly, an FN write operation may be implemented that may be selective, less damaging to a NVM cell, and may consume much less current, but may be slow. Unlike an FN erase operation, an FN write operation may be selective, when a suitable inhibit voltage such as the positive deselection voltage 38 is applied to the sources of the floating gate transistors of the deselected memory cells via the bitlines in FIG. 3 as apparent from a comparison of FIGS. 1 and 3.

The FIGS. 1 to 4 show voltage conditions for a Hot Source Triple Poly, HS3P, memory cell according to embodiments. In particular, FIGS. 1 and 2 contrast an FN-erase operation with an HH-erase operation, while FIGS. 3 and 4 contrast an FN-write operation with an HE-write operation.

Of course, voltage conditions for a 1-Transistor Uniform Channel Program, 1T-UCP, memory cell may be different and will be apparent to a person skilled in the art. Further embodiments, may comprise HS3P memory cell with two different erase and/or write operations. In another embodiment, a flash memory with 1T-UCP memory cells may comprise with two different erase and/or write operations. In a still further embodiment, a flash memory may comprise 2T-UCP memory cells that may be erased or written by two different erase and/or write operations.

The concepts disclosed herein may also be applied in NVM types that cannot be erased selectively. Very generally speaking, embodiments may relate to a combination of two or more different switchable erase and/or write operations for any NVM, i.e. every NVM that in sum has three or more different write or erase operations.

Further with regard to the Figures, FIG. 1 shows possible voltage conditions to select a page of HS3P memory cells in a flash memory for an FN-erase operation according to an embodiment. In the embodiment according to FIG. 1, an upper page of memory cells is selected for FN-erase operations by applying the first negative selection voltage 15, here −5 V to the control gates 14, CGs, of the floating gate, FG, transistors 10 of the selected memory cells. In contrast to that, a lower page of memory cells is deselected for FN-erase operations by applying a first positive deselection voltage 16, here 10 V to the CGs of the FG transistors of the deselected memory cells.

According to the "Fowler-Nordheim"-erase operation applied to the selected memory page, a possible negative charge on the FGs 11 of the FG transistors 10 of the selected memory cell is caused to tunnel from the FGs 11 by applying a first positive voltage 18 via a select transistor to the drains 12 of the FG transistors and leaving the sources 13 of the FG transistors floating by leaving the corresponding bitlines floating. In this way, the memory cells of the selected memory page may be erased by neutralizing the possible negative charge on the FGs 11 of the selected memory page. Moreover, the FG transistors of the lower memory page may be deselected for the above-mentioned FN-erase operations by applying a positive deselection voltage 16, here 10 V, to the CGs 24 of the FG transistors of the lower memory page. In this regard, the FN-erase operation as shown in FIG. 1 may be performed with less than bitwise selectivity.

Figure 2:
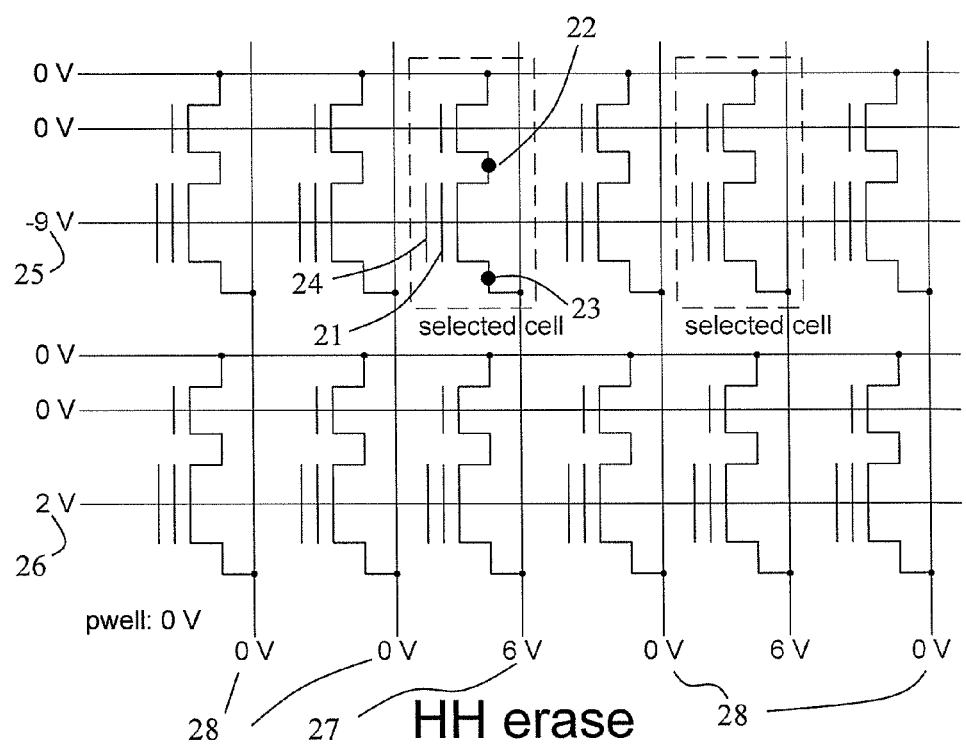
FIG. 2 is a schematic diagram illustrating possible voltage conditions to select two individual memory cells in a flash memory for a "Hot Hole"-erase operation according to an embodiment.

FIG. 2 shows possible voltage conditions to select two individual memory cells in a flash memory for a "Hot Hole"-erase operation according to an embodiment. In the embodiment according to FIG. 2, the two memory cells are selected for HH-erase operations by applying a first positive selection voltage 27, here 6 V to the sources 23 of the FG transistors of the selected memory cells via the respective bitlines. In contrast to that, the rest of the memory cells is deselected for HH-erase operations by applying a ground potential 28, i.e. 0 V, to the sources 23 of the FG transistors of the deselected memory cells via the respective bitlines. In this regard, the HH-erase operation as shown in FIG. 2 may be performed with bitwise selectivity.

According to the "Hot Hole"-erase operation applied to the selected memory cells, a positive charge—accelerated by a first non-zero voltage between the drains 22 and sources 23 of the FG transistors of the selected memory cells and resulting in "Hot Holes"—is caused to tunnel onto the FGs 21 with an increased likelihood by applying a first negative voltage 25, here −9 V, to the CGs 24 of the FG transistors of the upper memory page. In other words, the "Hot Holes" are injected in the FGs 21 of the FG transistors of the selected memory cells. In this way, the selected memory cells may be erased by neutralizing the possible negative charge on the FGs 21 of the selected memory cells. Moreover, the FG transistors of the lower memory page may be deselected for the above-mentioned "Hot Hole" injection by applying a positive deselection voltage 26, here 2 V, to the CGs 24 of the FG transistors of the lower memory page.

Figure 3:
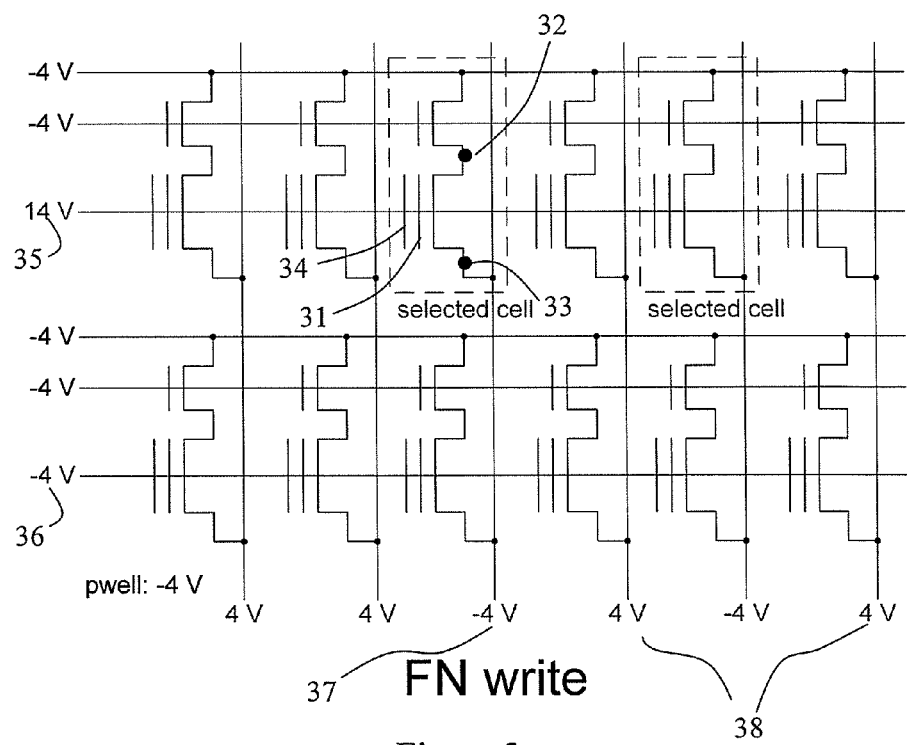
FIG. 3 is a schematic diagram illustrating possible voltage conditions to select two individual memory cells in a flash memory for a "Fowler-Nordheim"-write operation according to an embodiment.

FIG. 3 shows possible voltage conditions to select two individual memory cells in a flash memory for a "Fowler-Nordheim"-write operation according to an embodiment. In the embodiment according to FIG. 3, the two memory cells are selected for FN-write operations by applying a second negative selection voltage 37, here −4 V to the sources 33 of the FG transistors of the selected memory cells via the respective bitlines. In contrast to that, the rest of the memory cells are deselected for FN-write operations by applying a second positive deselection voltage 38, here 4 V, to the sources 33 of the FG transistors of the deselected memory cells via the respective bitlines. In this regard, the FN-write operation as shown in FIG. 3 may be performed with bitwise selectivity.

According to the "Fowler-Nordheim"-write operation applied to the selected memory page, a negative charge is caused to tunnel onto the FGs 31 of the selected memory cells by applying the second negative selection voltage 37 to the sources of the FG transistors of the selected memory cells via the respective bitlines, and a third positive voltage 35, here 14 V, to the CGs 34 and leaving the drains 32 of the FG transistors floating via the select transistors of the memory cells that are switched off. In this way, the memory cells of the selected memory cells may be written by applying the negative charge on the FGs 31 of the selected memory cells. Moreover, the FG transistors of the lower memory page may be deselected for the above-mentioned FN-write operations by applying a negative deselection voltage 36, here −4 V, to the CGs 34 of the FG transistors of the lower memory page.

Figure 4:
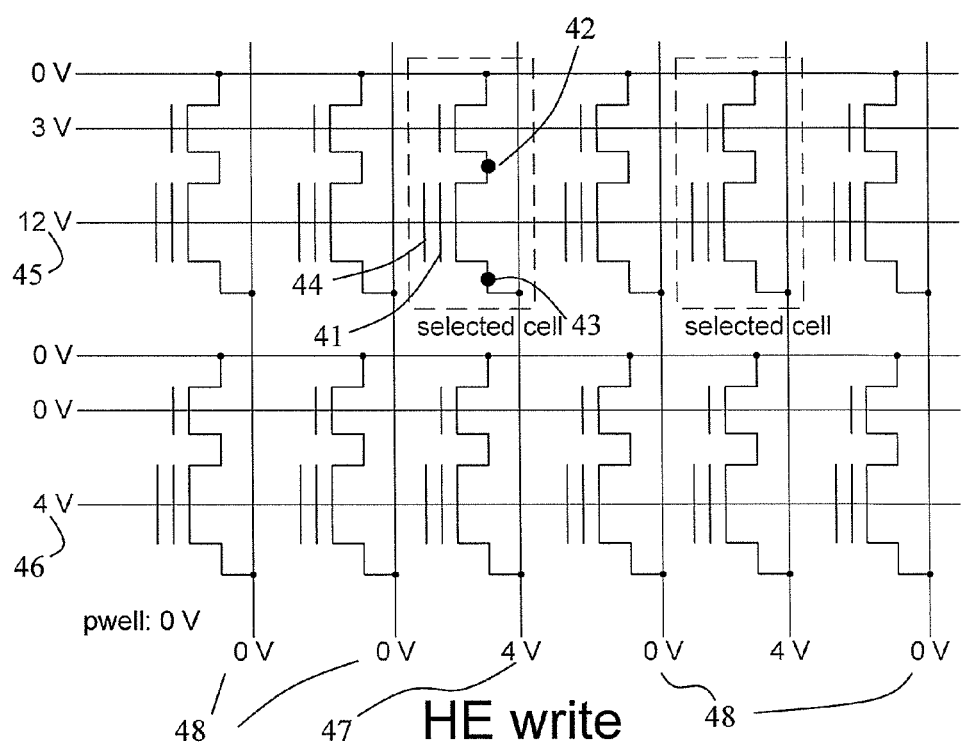
FIG. 4 is a schematic diagram illustrating possible voltage conditions to select two individual memory cells in a flash memory for a "Hot Electron"-write operation according to an embodiment.

FIG. 4 shows possible voltage conditions to select two individual memory cells in a flash memory for a "Hot Electron"-write operation according to an embodiment. In the embodiment according to FIG. 4, the two memory cells are selected for HE-write operations by applying a second positive selection voltage 47, here 4 V to the sources 43 of the FG transistors of the selected memory cells via the respective bitlines. In contrast to that, the rest of the memory cells are deselected for HE-write operations by applying a ground potential 48, i.e. 0 V, to the sources 43 of the FG transistors of the deselected memory cells via the respective bitlines. In this regard, the HE-write operation as shown in FIG. 4 may be performed with bitwise selectivity.

According to the "Hot Electron"-write operation applied to the selected memory cells, a negative charge—accelerated by a second non-zero voltage between the drains 42 and sources 43 of the FG transistors of the selected memory cells and resulting in "Hot Electrons"—is caused to tunnel onto the FGs 41 with an increased likelihood by applying a second positive voltage 45, here 12 V, to the CGs 44 of the FG transistors of the upper memory page. In other words, "Hot Electrons" are injected in the FGs 41 of the FG transistors of the selected memory cells. In this way, the selected memory cells may be written by applying the negative charge on the FGs 41 of the selected memory cells. Moreover, the FG transistors of the lower memory page may be deselected for the above-mentioned "Hot Electron" injection by applying a low positive deselection voltage 46, here 4 V, to the CGs 44 of the FG transistors of the lower memory page. In the embodiment in FIG. 4, the low positive deselection voltage 46 for the lower memory page corresponds to the second positive selection voltage 47 applied to the sources 43 of the FG transistors of memory cell selected for HE-write.

Figure 5:
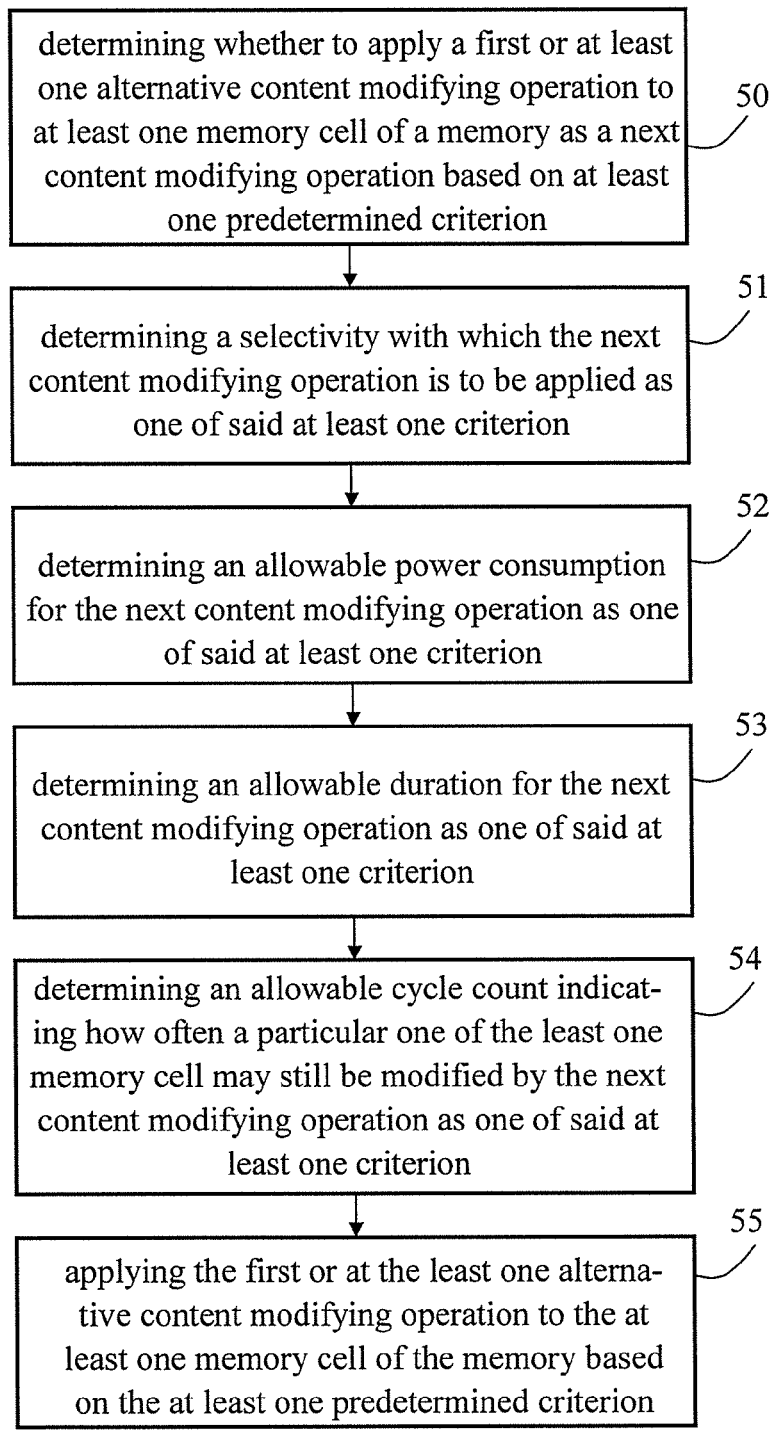
FIG. 5 is a flow chart diagram of an embodiment for a method to select between a least two different erase operations to erase a flash memory based on a determination of a most suitable erase operation for a particular erase operation with the flash memory.

FIG. 5 shows a flow diagram of an embodiment for a method to select between a least two different erase operations to erase a flash memory based on a determination of a most suitable erase operation for a particular erase operation with the flash memory. At 50 of the method according to FIG. 5, it may be determined whether to apply a first or at least one alternative content modifying operation to at least one memory cell of a memory as a next content modifying operation based on at least one predetermined criterion. At 51 of the method according to FIG. 5, a selectivity may be determined with which the next content modifying operation is to be applied as one of the at least one criterion.

At 52 of the method according to FIG. 5, an allowable power consumption for the next content modifying operation as one of the at least one criterion may be determined. Still further, at 53 of the method according to FIG. 5, an allowable duration for the next content modifying operation as one of the at least one criterion may be determined. In addition, at 54 of the method according to FIG. 5, an allowable cycle count may be determined indicating how often a particular one of the least one memory cell may still be modified by the next content modifying operation as one of the at least one criterion. At 55 of the method according to FIG. 5, the first or the at least one alternative content modifying operation is applied to the at least one memory cell of the memory based on the at least one predetermined criterion.

With respect to the above-described embodiments which relate to the Figures, it is emphasized that the embodiments basically served to increase the comprehensibility. In addition to that, the following further embodiments try to illustrate a more general concept. However, also the following embodiments are not to be taken in a limiting sense. Rather—as expressed before—the scope of the present invention is defined by the appended claims.

In this regard, one embodiment relates to a nonvolatile memory device adapted to switchably use a "Fowler-Nordheim"-erase, FN-erase, operation as a bulk erase operation to erase a plurality of only coarsely selectable one of a plurality of memory cells of the memory device, or use a "Hot Hole"-erase, HH-erase, operation as a selective erase operation to erase at least one individually selectable one of the plurality of memory cells of the memory device.

In an embodiment, the FN-erase operation is performable for a first erase cycle count for a particular memory cell without causing critical damage to the particular memory cell, while the HH-erase operation is performable for a second erase cycle count for the particular memory cell without causing critical damage to the particular memory cell. In this embodiment, the first erase cycle count is higher than the second erase cycle count.

A further embodiment of the nonvolatile memory device is adapted to switchably either use the FN-erase operation for non-timing critical bulk erase operations to enable an increased endurance of the correspondingly erased memory cells, or use the HH-erase operation for timing critical selective erase operations to enable a repair of individual disturbed memory cells.

A still further embodiment relates to a nonvolatile memory device, adapted to switchably use either a "Hot Electron"-write, HE-write, operation for timing critical selective write operations, or use a "Fowler-Nordheim"-write, FN-write, operation for non-timing critical selective write operations to enable an increased endurance of the correspondingly written memory cells.

A further embodiment relates to a nonvolatile memory device adapted to switch between two or more erase operations and/or two or more write operations for erasing of and/or writing to at least one memory cell of the memory device.

In one embodiment, the memory device is further adapted to determine to which one of the two or more erase operations and/or two or more write operations the memory device is switched for a particular erase and/or write operation based on at least one of the following determinations. Namely, a first determination whether the erase and/or write operation is to be applied with bitwise or less than bitwise selectivity, a second determination whether a projected power consumption of the erase and/or write operation is allowed to be above a predetermined power limit or not, a third determination whether a projected duration of the erase and/or write operation is allowed to be above a predetermined duration limit or not, and a forth determination whether a current cycle count for the at least one memory cell to be written and/or erased is within a predetermined range of a cycle count limit specific for the erase and/or write operation or not.

In another embodiment, the memory device is switched to a following one of the two or more erase operations and/or the two or more write operations for the particular erase and/or write operation: a "Hot Hole"-erase, HH-erase, operation, a "Hot Electron"-write, HE-write, operation, and/or a "Fowler-Nordheim"-write, FN-write, operation in case the erase and/or write operation is to be applied with bitwise selectivity, or an FN-erase operation otherwise.

Moreover, in an embodiment, the memory device is switched to the HH-erase operation and/or the HE-write operation in case the projected power consumption of the erase and/or write operation is allowed to be above the predetermined power limit, or the FN-erase operation and/or the FN-write operation otherwise.

Furthermore, in the same or a different embodiment, the memory device is switched to the FN-erase operation and/or the FN-write operation in case the projected duration of the erase and/or write operation is allowed to be above the predetermined duration limit, or the HH-erase operation and/or the HE-write operation otherwise.

Further referring to the same or another embodiment, the memory device is switched to the HH-erase operation and/or the HE-write operation in case the current cycle count for the at least one memory cell to be written and/or erased is below a cycle count limit specific for the HH-erase operation and/or the HE-write operation.

Alternatively, in the same or another embodiment, the memory device is switched to the FN-erase operation and/or the FN-write operation in case the current cycle count for the at least one memory cell to be written and/or erased is below a cycle count limit specific for the FN-erase operation and/or the FN-write operation.

In a further embodiment, the memory device is adapted to switch between at least a "Fowler-Nordheim"-write, FN-write, operation and a "Hot Electron"-write, HE-write, operation as the two or more write operations.

According to another embodiment, the two or more erase operations comprise an incremental "Hot Hole"-erase operation to selectively erase a predetermined selection of memory cells such as memory cells addressable by a predetermined wordline within the memory device.

In an embodiment, the two or more erase operations comprise a "Hot Hole"-erase operation to selectively erase predetermined memory cells as an erase operation that is comparable with an erase operation within an EEPROM device to yield a real EEPROM behavior of the memory device.

A further embodiment relates to a nonvolatile memory device adapted to switchably apply a first erase operation to a memory cell, wherein a negative charge on a floating gate, FG, of an FG transistor of the memory cell is caused to tunnel from the FG by applying a first positive voltage to a drain of the FG transistor and leaving the source of the FG transistor floating, or a second erase operation to the memory cell, wherein a positive charge—accelerated by a first non-zero voltage between the drain and source of the FG transistor of the memory cell and resulting in "Hot Holes"—is caused to tunnel onto the FG with an increased likelihood by applying a first negative voltage to a control gate, CG, of the FG transistor. In this embodiment, the first and the second erase operations erase the memory cell by neutralizing a negative charge on the FG.

In an embodiment, the memory device is further adapted to switchably apply a first write operation to a memory cell, wherein a negative charge—accelerated by a second non-zero voltage between the drain and source of the FG transistor of the memory cell and resulting in "Hot Electrons"—is caused to tunnel onto the FG with an increased likelihood by applying a second positive voltage to the CG, or a second write operation to the memory cell, wherein a negative charge is caused to tunnel onto the FG by applying a second negative voltage to the source of the FG transistor, a third positive voltage to the CG and leaving the drain of the FG transistor floating; wherein the first and the second write operation write the memory cell by applying a negative charge onto the FG.

According to an embodiment, the memory device is further adapted to select a plurality of memory cells for erasure by the first erase operation by applying a first negative selection voltage to the CGs of the plurality of FG transistors of the plurality of memory cells, while deselecting a further plurality of memory cells for erasure by the first erase operation by applying a first positive deselection voltage to the CGs of the further plurality of FG transistors of the further plurality of memory cells.

A further embodiment of the memory device is adapted to select a particular memory cell for erasure by the second erase operation by applying a first positive selection voltage to the source of the FG transistor of the particular memory cell, while deselecting a plurality of other memory cells for erasure by the second erase operation by applying a ground potential to the sources of the FG transistors of the plurality of other memory cells.

In an embodiment, the memory device is further adapted to select a particular memory cell for writing by the first write operation by applying a second positive selection voltage to the source of the FG transistor of the particular memory cell, while deselecting a plurality of other memory cells for writing by the first write operation by applying a ground potential to the sources of the FG transistors of the other memory cells.

A still further embodiment of the memory device is adapted to select a particular memory cell for writing by the second write operation by applying a second negative selection voltage to the source of the FG transistor of the particular memory cell, while deselecting a plurality of other memory cells for writing by the second write operation by applying a second positive deselection voltage to the sources of the FG transistors of the plurality of other memory cells.

A further embodiment relates to a method for erasing of and/or writing to a nonvolatile memory switching between two or more erase operations and/or two or more write operations for erasing of and/or writing to least one memory cell of the memory enabling to select a most suitable erase and/or write operation for a particular erase and/or write operation within the memory.

In an embodiment, the switching comprises switching between at least one of a "Fowler-Nordheim"-erase, FN-erase, operation to erase a plurality of only coarsely selectable memory cells of the memory, or a "Hot Hole"-erase, HH-erase, operation to erase at least one individually selectable one of the plurality of memory cells of the memory faster than by the FN-erase operation; and an FN-write operation for non-timing critical selective write operations to enable an increased endurance of the correspondingly written memory cells, or a "Hot Electron"-write, HE-write, operation for timing critical selective write operations.

An embodiment of the method further comprises the step of determining to which one of the two or more erase operations and/or two or more write operations the memory is switched for the particular erase and/or write operation based on at least one of the following determinations. Namely, a first determination whether the erase and/or write operation is to be applied with bitwise or less than bitwise selectivity, a second determination whether a projected power consumption of the erase and/or write operation is allowed to be above a predetermined power limit or not, a third determination whether a projected duration of the erase and/or write operation is allowed to be above a predetermined duration limit or not, and a forth determination whether a current cycle count for the at least one memory cell to be written and/or erased is within a predetermined range of a cycle count limit specific for the erase and/or write operation or not.

A still further embodiment relates to a method for modifying content of a nonvolatile memory comprising determining whether to apply a first or at least one alternative content modifying operation to at least one memory cell of the memory as a next content modifying operation based on at least one predetermined criterion.

In an embodiment, the at least one predetermined criterion comprises at least one of a selectivity with which the next content modifying operation is to be applied, an allowable power consumption for the next content modifying operation, an allowable duration for the next content modifying operation, and an allowable cycle count indicating how often a particular one of the least one memory cell may still be modified by the next content modifying operation.

According to an embodiment, the first content modifying operation comprises a "Fowler-Nordheim"-erase, FN-erase, operation, and the at least one alternative content modifying operation comprises a "Hot Hole"-erase, HH-erase, operation.

According to a further embodiment, the first content modifying operation comprises a "Fowler-Nordheim"-write, FN-write, operation, and the at least one alternative content modifying operation further comprises a "Hot Electron"-write, HE-write, operation.

In an embodiment, the first content modifying operation comprises a first erase operation, wherein a negative charge on a floating gate, FG, of an FG transistor of the at least one memory cell is caused to tunnel from the FG by applying a first positive voltage to a drain of the FG transistor and leaving the source of the FG transistor floating. In this embodiment, the at least one alternative content modifying operation comprises a second erase operation, wherein a positive charge—accelerated by a first non-zero voltage between the drain and source of the FG transistor of the at least one memory cell and resulting in "Hot Holes"—is caused to tunnel onto the FG with an increased likelihood by applying a first negative voltage to a control gate, CG, of the FG transistor.

In a further embodiment, the first content modifying operation further comprises a first write operation, wherein a negative charge—accelerated by a second non-zero voltage between the drain and source of the FG transistor of the at least one memory cell and resulting in "Hot Electrons"—is caused to tunnel onto the FG with an increased likelihood by applying a second positive voltage to the CG. In this embodiment, the at least one alternative content modifying operation further comprises: a second write operation, wherein a negative charge is caused to tunnel onto the FG by applying a second negative voltage to the source of the FG transistor, a third positive voltage to the CG and leaving the drain of the FG transistor floating.

In a further embodiment, the determining enables to select a most suitable content modifying operation for a particular content modifying operation within the memory.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A nonvolatile memory device comprising:
   circuitry adapted to switch the memory device between two or more different erase operations and/or two or more different write operations for erasing and/or writing to at least one memory cell of the memory device;
   the circuitry further adapted to determine to which one of the two or more different erase operations and/or two or more different write operations the memory device is switched for a particular erase and/or write operation based on at least one of:
   whether the erase and/or write operation is to be applied with bitwise or less than bitwise selectivity;
   whether a projected power consumption of the erase and/or write operation is allowed to be above a predetermined power limit or not;
   whether a projected duration of the erase and/or write operation is allowed to be above a predetermined duration limit or not; and
   whether a current cycle count for the at least one memory cell to be written and/or erased is within a predetermined range of a cycle count limit specific for the erase and/or write operation or not.

2. The memory device of claim 1, wherein the memory device is switched to a following one of the two or more different erase operations and/or the two or more different write operations for the particular erase and/or write operation:
   a "Hot Hole"-erase, HH-erase, operation, a "Hot Electron"-write, HE-write, operation, and/or a "Fowler-Nordheim"-write, FN-write, operation in case the erase and/or write operation is to be applied with bitwise selectivity, or an FN-erase operation otherwise;
   the HH-erase operation and/or the HE-write operation in case the projected power consumption of the erase and/or write operation is allowed to be above the predetermined power limit, or the FN-erase operation and/or the FN-write operation otherwise;
   the FN-erase operation and/or the FN-write operation in case the projected duration of the erase and/or write operation is allowed to be above the predetermined duration limit, or the HH-erase operation and/or the HE-write operation otherwise; or
   the HH-erase operation and/or the HE-write operation in case the current cycle count for the at least one memory cell to be written and/or erased is below a cycle count limit specific for the HH-erase operation and/or the HE-write operation, or the FN-erase operation and/or the FN-write operation in case the current cycle count for the at least one memory cell to be written and/or erased is below a cycle count limit specific for the FN-erase operation and/or the FN-write operation.

3. The memory device of claim 1, adapted to switch between at least a "Fowler-Nordheim"-write, FN-write, operation and a "Hot Electron"-write, HE-write, operation as the two or more different write operations.

4. The memory device of claim 1, wherein one of the two or more different erase operations comprise an incremental "Hot Hole"-erase operation to selectively erase a predetermined selection of memory cells, wherein the predetermined selection of memory cells comprises one or more memory cells addressable by a predetermined wordline within the memory device.

5. The memory device of claim 1, wherein one of the two or more different erase operations comprise a "Hot Hole"-erase operation to selectively erase predetermined memory cells as an erase operation that is comparable with an erase operation within an EEPROM device to yield an EEPROM behavior of the memory device.

6. A nonvolatile memory device comprising:
   circuitry adapted to switch between two or more different erase operations and/or two or more different write operations for erasing and/or writing to at least one memory cell of the memory device, wherein one of the two or more different erase operations comprises a "Hot Hole"-erase operation, the circuitry adapted to selectively erase, with the "Hot Hole"-erase operation, predetermined memory cells whereby the "Hot Hole"-erase operation constitutes an erase operation that is comparable with an erase operation within an EEPROM device to yield an EEPROM behavior of the memory device.

7. The memory device of claim 6, wherein the two or more different erase operations and/or the two or more different write operations for erasing and/or writing to the at least one memory cell of the memory device comprise two or more different erase operations for erasing the at least one memory cell of the memory device.

8. A nonvolatile memory device comprising:
   circuitry adapted to switch between two or more different erase operations and/or two or more different write operations for erasing and/or writing to at least one memory cell of the memory device, wherein one of the two or more different erase operations comprise an incremental "Hot Hole"-erase operation, the circuitry adapted to selectively erase, with the "Hot Hole"-erase operation, a predetermined selection of memory cells, wherein the predetermined selection of memory cells comprises one or more memory cells addressable by a predetermined wordline within the memory device.

\* \* \* \* \*